(12) United States Patent
Shiobara et al.

(10) Patent No.: US 8,648,527 B2
(45) Date of Patent: Feb. 11, 2014

(54) DISPLAY APPARATUS

(71) Applicant: Canon Kabushiki Kaisha, Tokyo (JP)

(72) Inventors: Satoru Shiobara, Mobara (JP);
Takayuki Sumida, Kawasaki (JP); Koji Ishizuya, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/625,225

(22) Filed: Sep. 24, 2012

(65) Prior Publication Data
US 2013/0075744 A1    Mar. 28, 2013

(30) Foreign Application Priority Data

Sep. 28, 2011    (JP) ................. 2011-212118

(51) Int. Cl.
*H01L 51/50*    (2006.01)

(52) U.S. Cl.
USPC ........... 313/504; 313/503; 313/506; 313/507; 313/508; 313/509

(58) Field of Classification Search
USPC .............. 313/503–509, 512; 257/743, 59, 72, 257/649, E51.02, E51.021
See application file for complete search history.

(56) References Cited

U.S. PATENT DOCUMENTS

| | | | | |
|---|---|---|---|---|
| 7,990,058 B2 * | 8/2011 | Cok et al. | ...................... | 313/506 |
| 8,049,405 B2 * | 11/2011 | Adachi et al. | ................. | 313/503 |
| 8,067,887 B2 * | 11/2011 | Sant et al. | ...................... | 313/504 |
| 8,246,233 B2 * | 8/2012 | Cornelissen et al. | ......... | 362/612 |

FOREIGN PATENT DOCUMENTS

| | | |
|---|---|---|
| JP | 2004-296429 A | 10/2004 |
| JP | 2005-322490 A | 11/2005 |

OTHER PUBLICATIONS

U.S. Appl. No. 13/564,405, filed Aug. 1, 2012.
U.S. Appl. No. 13/590,802, filed Aug. 21, 2012.
U.S. Appl. No. 13/600,379, filed Aug. 31, 2012.
U.S. Appl. No. 13/603,929, filed Sep. 5, 2012.

* cited by examiner

*Primary Examiner* — Matthew W Such
*Assistant Examiner* — Stephen C Smith
(74) *Attorney, Agent, or Firm* — Fitzpatrick, Cella, Harper & Scinto

(57) ABSTRACT

Provided is a display apparatus using an organic EL device in which blur in a display image to be a problem for the display apparatus is reduced while propagating light propagating through a high-refractive-index transparent layer is efficiently extracted outside. The display apparatus has a configuration in which a high-refractive-index transparent layer is provided on a light exit side of the organic EL device, a light extraction structure is provided on the high-refractive-index transparent layer so as to surround each of subpixels, a visible light absorbing member is arranged between pixels adjacent to each other, and the visible light absorbing member is not arranged in a region between subpixels adjacent to each other within a pixel.

15 Claims, 3 Drawing Sheets

DISPLAY APPARATUS

BACKGROUND OF THE INVENTION

1. Field of the Invention

The present invention relates to a display apparatus including an organic electroluminescence (EL) device, and more particularly, to a full-color display apparatus in which one pixel includes multiple subpixels having different emission colors.

2. Description of the Related Art

In recent years, organic light-emitting devices that emit light spontaneously with a low drive voltage of about several volts are drawing attention. The organic electroluminescence (EL) device utilizes its excellent features such as surface emitting characteristics, light weight, and visibility and is being put into practical use as a light-emitting apparatus of a thin display, a lighting equipment, a head-mounted display, or a light source for a printhead of an electrophotographic printer.

The organic EL device has structure in which an emission layer made of an organic material and multiple layers made of organic materials having separated functions are sandwiched between an anode and a cathode, and an electrode on at least one light exit side is transparent. Due to this stack structure, light traveling in a direction at a critical angle or larger in each interface determined by a refractive index of the emission layer, a medium on the light exit side, and a refractive index of air into which light is finally released is totally reflected to be confined as propagating light in the device. The propagating light is absorbed by organic compound layers and metal electrodes in the device and is not extracted out of the device, with the result that light extraction efficiency is lowered.

For improving the light extraction efficiency, there have been proposed a number of methods of changing a traveling direction of light to break the total reflection condition, such as a method of providing fine uneven structure or lens structure on the surface on the light exit side so as to extract the propagating light out of the device. In particular, as a method having high improvement effects, there has been proposed a method of providing a transparent layer, the refractive index of which is equal to or higher than that of an emission layer, adjacently to a light exit side of a transparent electrode, and further providing a region for causing disturbance in reflection/scattering angles of light on the light exit side of the transparent layer or in the transparent layer (Japanese Patent Application Laid-Open No. 2004-296429).

According to the above-mentioned method, based on the classical Snell's law, propagating light in the emission layer which occupies about 80% of the light emitted by the emission layer is pulled in a high-refractive-index transparent layer whose refractive index is higher than that of the emission layer to be converted into propagating light in the transparent layer. The propagating light thus obtained is extracted out of the device through the region for causing disturbance in reflection/scattering angles of light on the surface of the transparent layer or in the transparent layer.

However, when the method of causing light to propagate through the high-refractive-index transparent layer is applied to a display apparatus such as a display, a peculiar problem occurs. Light which is guided to the high-refractive-index transparent layer and is finally output to the air through the region for causing disturbance in reflection/scattering angles of light includes light traveling at an angle equal to or higher than a critical angle, which is originally supposed to be totally reflected. This light is recognized as light emitted from a position different from an actual light-emitting point due to parallax caused by the thickness of the high-refractive-index transparent layer, and hence, there arises a problem of blur in a displayed image. In order to solve this problem, there has been proposed a method of adjusting the thickness of a substrate (although not the high-refractive-index transparent layer), through which light propagates, to a predetermined proportion or less of a pixel size (Japanese Patent Application Laid-Open No. 2005-322490).

Further, when the light guided to the high-refractive-index transparent layer enters the region for causing disturbance in reflection/scattering angles, the light is not necessarily extracted to an air side through one incidence. Light whose traveling direction has been changed by the region for causing disturbance in reflection/scattering angles is also totally reflected again to propagate through the high-refractive-index transparent layer in the case where the light travels at an angle equal to or larger than a critical angle in an interface between the high-refractive-index transparent layer and the air. Consequently, the light propagates laterally through the high-refractive-index transparent layer and is eventually output to the air side at a position away from the light-emitting point at which the total reflection condition has been broken. Therefore, there still arises a problem of blur in a displayed image. In particular, as the refractive index of the transparent layer is higher, the amount of high-angle component light is larger, and hence, the number of times at which the light enters the region for causing disturbance in reflection/scattering angles decreases, and the waveguide length in the lateral direction up to the point where the light is extracted to the air side increases, which renders the problem more serious.

SUMMARY OF THE INVENTION

It is an object of the present invention to provide a display apparatus using an organic electroluminescence (EL) device which is capable of efficiently extracting, out of the device, propagating light which propagates through a transparent layer having a refractive index higher than that of an organic compound layer, to thereby reduce blur in a display image.

That is, according to an exemplary embodiment of the present invention, there is provided a display apparatus, including multiple pixels each including multiple subpixels having different emission colors, each of the multiple subpixels including an organic electroluminescence device which includes:
 a first electrode;
 a second electrode; and
 an organic compound layer including an emission layer disposed between the first electrode and the second electrode, in which the display apparatus further includes a transparent layer having a refractive index higher than a refractive index of the organic compound layer, the transparent layer being disposed on a light exit side of the organic electroluminescence device, in which the display apparatus further includes a light extraction structure provided on the transparent layer and an outer side of each of the multiple subpixels, and in which the display apparatus further includes a light absorbing member disposed in a region between pixels adjacent to each other, and the light absorbing member is not exposed in a region between subpixels adjacent to each other within each of the multiple pixels.

According to the present invention, the display apparatus in which blur in a display image is reduced while light extraction efficiency is enhanced can be provided.

Further features of the present invention will become apparent from the following description of exemplary embodiments with reference to the attached drawings.

DESCRIPTION OF THE EMBODIMENTS

A display apparatus of the present invention includes multiple pixels each including multiple subpixels having different emission colors, and each subpixel includes an organic electroluminescence (EL) device. The organic EL device includes a first electrode, multiple organic compound layers including an emission layer having a light-emitting region provided on the first electrode, and a second electrode. The organic EL device emits light through use of energy generated by the recombination of holes and electrons which are injected into the organic compound layers by application of a voltage across the first and second electrodes. One of the first electrode and the second electrode is a reflective electrode, and the other thereof is a transparent electrode. Further, one of the first electrode and the second electrode is an anode and the other thereof is a cathode. In the display apparatus of the present invention, the reflective electrode is formed as the first electrode on a support substrate, and emitted light is extracted from the transparent electrode side. In the display apparatus of the present invention, in order to effectively extract light emitted in the organic EL device outside, a high-refractive-index transparent layer having a refractive index higher than those of the organic compound layers is provided adjacently to the transparent electrode. Further, a light extraction structure for extracting the light is disposed adjacently to the high-refractive-index transparent layer. This configuration enables light from the emission layer to reach the light extraction structure without being totally reflected, and to be effectively extracted outside.

According to the present invention, in order to solve a problem of blur on a display, a visible light absorbing member is arranged in a region between pixels adjacent to each other. Thus, blur in a display image caused by color mixing in an inter-pixel region can be suppressed.

Figure 1:
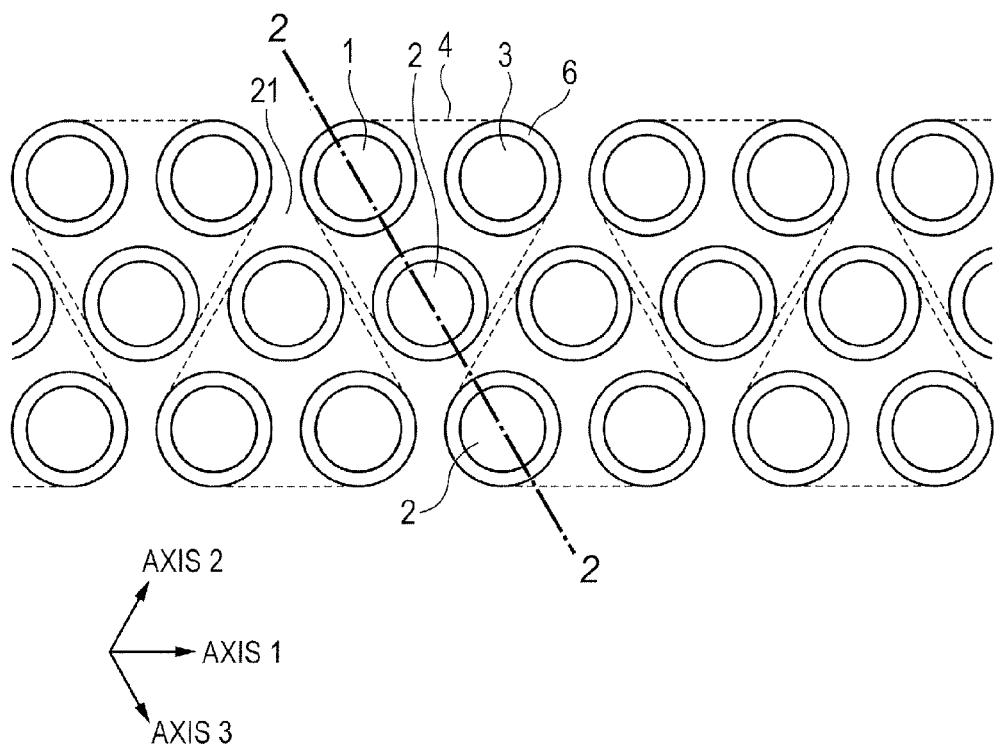
FIG. 1 is a top view schematically illustrating a configuration of a display apparatus according to an embodiment of the present invention.

Hereinafter, the present invention is described by way of embodiments. FIG. 1 is a top view illustrating a planar layout of a display apparatus according to one embodiment of the present invention. Subpixels 1, 2, and 3 respectively emitting lights of three primary colors (blue, green, and red) form one pixel 4.

In the display apparatus of the present invention, as illustrated in FIG. 1, a light extraction structure 6 is provided so as to surround the entire outer circumference of each of the subpixels 1, 2, and 3 included in the pixel 4, and a visible light absorbing member is disposed in a region (inter-pixel region) 21 between pixels adjacent to each other. The pixel 4 in the display apparatus of the present invention includes the multiple subpixels 1, 2, and 3, and the light extraction structures 6, and forms a minimum unit of a display. Note that, a region including the light extraction structures 6 provided for the respective subpixels 1, 2, and 3 is defined as the pixel 4. In the present invention, the light extraction structure 6 only needs to be disposed so as to surround the outer circumference of each of the subpixels 1, 2, and 3, and may have a region overlapping the pixel.

In the display apparatus of the present invention, a light-emitting region of each of the subpixels 1, 2, and is determined by an aperture area of a patterned reflective electrode 9 formed on a support substrate 8 (described later) side. In this case, cross-sectional structure of a site indicated by line 2-2 of FIG. 1 is as schematically illustrated in FIG. 2

Figure 2:
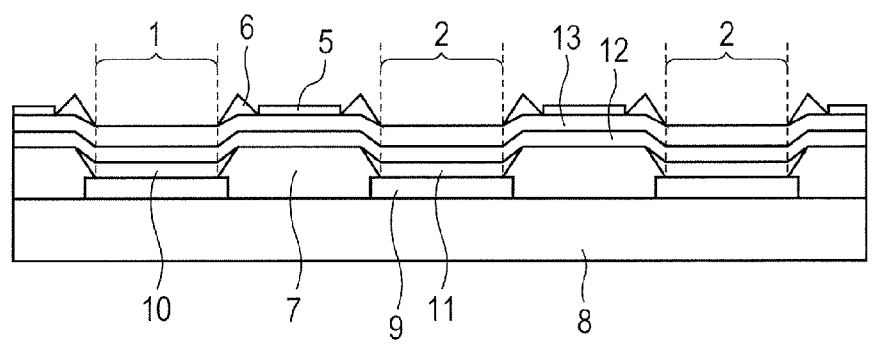
FIG. 2 is a cross-sectional view taken along line 2-2 in FIG. 1.

Further, in the configuration of FIG. 2, although a bank 7 is provided between the subpixels so as to avoid inter-pixel crosstalks, a short circuit, and the disconnection of electrode wiring or to insulate a region between the electrodes to limit a light-emitting region, the bank 7 is not necessarily required. In the case of FIG. 2, the aperture portion provided in the bank 7 corresponds to each of the subpixels 1, 2, and 3 of FIG. 1.

The subpixels 1, 2, and 3 are formed of organic EL devices having respective emission colors. In FIG. 2, each organic EL device includes the reflective electrode 9 as the first electrode on the support substrate 8 and an organic compound layer 10 or 11 on the reflective electrode 9, and further, includes a transparent electrode 12 as the second electrode on a light exit side. The organic compound layers 10 and 11 each include an emission layer for emitting light according to the emission color of each of the subpixels 1, 2, and 3. The transparent electrode 12 is formed continuously over the entire display region and has, on a light exit side thereof (side opposite to the support substrate 8), a high-refractive-index transparent layer 13 having a refractive index higher than those of the organic compound layers 10 and 11. Further, each of the subpixels 1, 2, and 3 includes the light extraction structure 6 at the outer circumference thereof. Further, a visible light absorbing member 5 is formed in a region between subpixels adjacent to each other.

Figure 3:
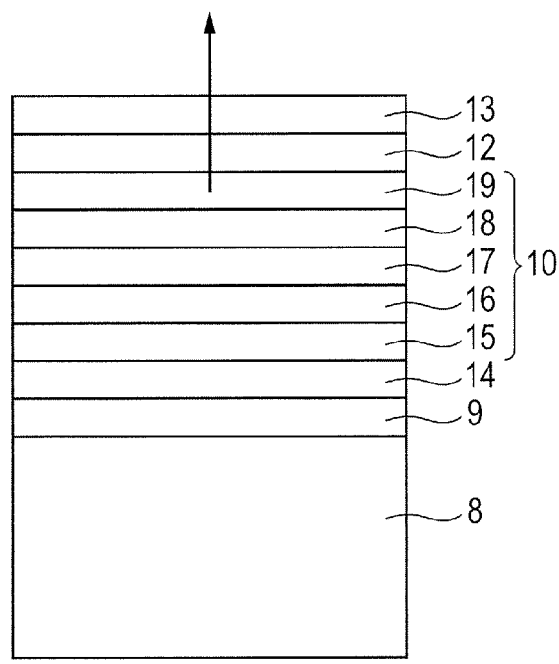
FIG. 3 is a cross-sectional view schematically illustrating an exemplary configuration of an organic EL device in the display apparatus of the present invention.

FIG. 3 is a schematic cross-sectional view illustrating a configuration of an organic EL device used in the subpixel 1. Note that, the cross-sectional structures of organic EL devices used in the subpixels 2 and 3 are the same as that of FIG. 3. Multiple organic compound layers 10 including an emission layer are disposed between the reflective electrode 9 and a transparent electrode 14, which are provided on the support substrate 8 as the first electrode, and a transparent electrode 12 as the second electrode, and it is well known that various stack configurations can be used from a viewpoint of emission efficiency, a driving lifetime, optical interference, etc. Note that, although only the reflective electrode 9 is illustrated as the first electrode in FIG. 2, the first electrode is formed of the reflective electrode 9 and the transparent electrode 14 in the configuration of FIG. 3, and any configuration may be applied to the present invention as long as the configuration is an electrode configuration having reflectivity.

FIG. 3 illustrates an exemplary configuration in which a hole injection layer 15, a hole transport layer 16, an emission layer 17, an electron transport layer 18, and an electron injection layer 19 are provided as the organic compound layer 10 of FIG. 2. The present invention has no limitation on materials contained in each layer. For example, any one of a fluorescent material and a phosphorescent material can be used as a material constituting the emission layer 17, and at least one kind of compounds may be contained in the emission layer 17 in addition to a host material and a light-emitting material so as to enhance device performance. Further, the hole transport layer 16 may function as an electron blocking layer, and the electron transport layer 18 may function as a hole blocking layer.

By adjusting the film thickness between a light-emitting position of the emission layer 17 and a reflective surface of the reflective electrode 9 of the organic compound layer 10, a light radiation distribution in the emission layer 17 can be controlled. In a display apparatus, by setting the film thickness of each organic compound layer so that the luminance becomes high particularly in the front direction, an emission color is also controlled by optical interference, and light is radiated in the front direction more efficiently. Specifically, by adjusting the optical distance from the light-emitting position of the emission layer 17 to an interface between the transparent electrode 14 and the reflective electrode 9 to be n/4 (n=1, 3, 5, . . . ) of an emission wavelength, front luminance in the light extraction direction from the emission layer 17 can be further enhanced.

In order to enhance the light extraction efficiency, it is preferred that the reflectivity of the reflective electrode 9 be higher. For example, as a material for the reflective electrode 9, a silver (Ag) electrode is more preferred than an aluminum (Al) electrode. As means for further enhancing the reflectivity, a procedure for stacking layers having different refractive indices as in a dielectric multi-layered film mirror may be used.

In the example of FIG. 3, emitted light is not confined in the device through use of the transparent electrode 12 as the second electrode. By providing a high-refractive-index transparent layer 13 on a light exit side of the transparent electrode 12, light containing a high-angle radiation optical component at an angle which cannot be radiated directly from the pixel enters the light extraction structure 6 and undergoes internal reflection to be extracted mainly in the front direction. Specifically, light on a high angle side can be effectively extracted outside through total reflection occurring between the high-refractive-index transparent layer 13 and the air or another medium.

Further, a translucent electrode may be used in place of the transparent electrode 12 of the second electrode. In this case, the reflectivity of the second electrode increases, with the result that the characteristics as an optical resonator are exhibited. However, a high-angle radiation optical component from the emission layer 17 is generated to some degree. Therefore, it may also be effective to use the translucent electrode even though an increase in the light extraction efficiency through use of the translucent electrode is smaller than that obtained by using the transparent electrode 12. This means that the effect does not particularly depend on whether or not the second electrode is transparent.

The high-refractive-index transparent layer 13 may be used as a barrier layer against the intrusion of gas such as water vapor or oxygen. In order for the high-refractive-index transparent layer 13 to function as a barrier layer, the film thickness thereof may be about several μm, although it depends on a material to be used and is within a range of 0.5 μm or more and 6.0 μm or less. The preferred film thickness also depends on the size of the light extraction structure 6, and hence, the film thickness does not need to be defined in the present invention. It is not preferred that the film thickness of the high-refractive-index transparent layer 13 be larger than 6.0 μm, because light easily propagates for a long distance in the high-refractive-index transparent layer 13, and the light is easily extracted from the light extraction structure 6 on an adjacent pixel 4. The film thickness of the high-refractive-index transparent layer 13 is more preferably 0.5 μm or more and 10.0 μm or less from a viewpoint of the enhancement of the light extraction efficiency.

Although the refractive indices of the organic compound layers 10 and 11, and an organic compound layer including a red emission layer vary depending on the material, the refractive indices thereof are generally about 1.6 to 2.0 in a blue light-emitting region, about 1.5 to 1.9 in a green light-emitting region, and about 1.5 to 1.8 in a red light-emitting region. Thus, the high-refractive-index transparent layer 13 only needs to have a refractive index at least higher than those of the organic compound layers 10 and 11, and the organic compound layer including the red emission layer used in the organic EL devices in the respective blue, green, and red light-emitting regions.

Further, as a material for the high-refractive-index transparent layer 13, titanium oxide, zirconium oxide, and zinc oxide can be used. However, it is difficult to process those materials. In the present invention, it is preferred that the high-refractive-index transparent layer 13 be formed of a silicon nitride ($SiN_x$) film or the like. No particular limitation is imposed on the element composition and element compositional ratio of the silicon nitride ($SiN_x$) film, and other elements may be mixed with nitrogen and silicon as main components. As a film formation process for obtaining the silicon nitride film, chemical vapor deposition (CVD) is used. Although the optical constant of the silicon nitride film also varies depending on the film formation conditions such as a substrate temperature and a film formation speed, the silicon nitride film only needs to be a transparent layer having a refractive index higher than those of the organic compound layers 10 and 11, and the organic compound layer including the red emission layer in the present invention. The light transmittance of the high-refractive-index transparent layer 13 is preferably 85% or more, more preferably 90% or more in a visible light region.

It is preferred that the light extraction structure 6 according to the present invention be formed by directly processing the high-refractive-index transparent layer 13, and the difference in refractive index between the high-refractive-index transparent layer 13 and the light extraction structure 6 be eliminated.

The light extraction structure 6 has a shape protruding at least in a light extraction direction, and a cross-sectional shape thereof may be a cone, a polygon, or a combination thereof. When such a structure is present, in the case where light of a high-angle radiation component, which cannot be extracted from a pixel, enters, the light at an arbitrary angle can be variously intensified by varying a light angle through use of internal reflection. Simultaneously, the light extraction efficiency is also enhanced.

In particular, the light extraction structure 6 having a cross-section in the shape of an isosceles triangle with an apex angle of 120° to 135° can effectively enhance the light extraction efficiency of front luminance. In the present invention, the light extraction structure 6 in which two base angles are about 25° can further enhance the front luminance, and hence, it is preferred to apply the present invention to a display. Accordingly, the light extraction efficiency of the organic EL device, which is generally considered to be about 20%, is enhanced remarkably. The light extraction structure 6 may be designed in such a manner that multiple conical structures surround the outer circumference of each light-emitting region (subpixel). Further, it is desired that the ring-shaped light extraction structure 6 (in which conical structures are linked in a loop shape) be arranged so as to surround the outer circumference of each subpixel in the case where the subpixels 1, 2, and 3 have a circular shape.

No particular limitation is imposed on a method of producing the light extraction structure 6. For example, a resist pattern is formed on a film of $SiN_x$ or the like by photolithography, and after that, the resist pattern is subjected to dry etching to form intended structure. Alternatively, an intended mold pattern is transferred onto $SiN_x$ by nanoimprinting, and after that, $SiN_x$ is processed by dry etching.

Figure 4:
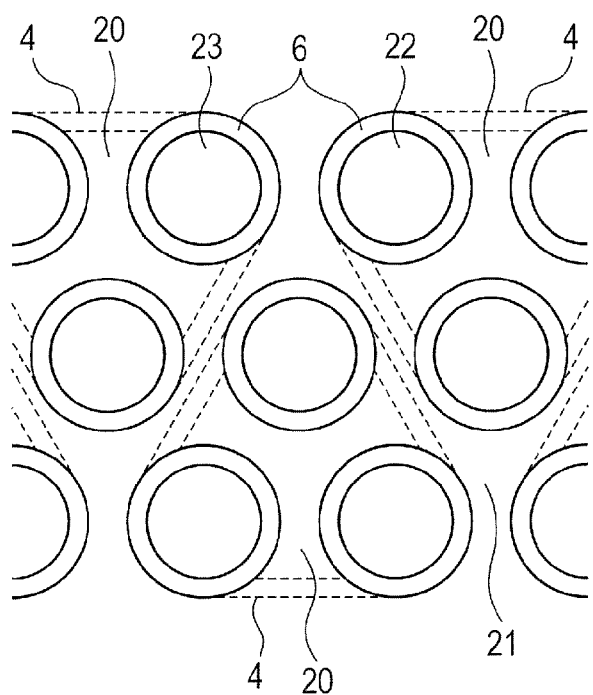
FIG. 4 is a top view schematically illustrating a pixel configuration in the display apparatus according to the embodiment of the present invention.

As in FIG. 4, when the light extraction structure 6 is provided on an inter-subpixel region 20, light emitted from the subpixels adjacent to the inter-subpixel region 20 enters the inter-subpixel region 20 to be extracted. However, color mixing caused by the light extraction structure 6 in the pixel 4, for example, color mixing among blue, green, and red is additive color mixing of gradation-controlled colors, and hence, has no effect on the control for obtaining intended chromaticity. The color mixing rather has an advantage in that light propagating to the adjacent subpixels can be extracted, and hence, the light extraction efficiency is enhanced.

On the other hand, emission colors from the subpixels, which are separately controlled for gradation, are to be mixed from the light extraction structure 6 provided on the inter-pixel region 21. For example, color mixing of a red subpixel 3 and a blue subpixel 1 which are included in the different pixels 4 and are adjacent to each other with the inter-pixel region 21 interposed therebetween ends up becoming additive color mixing which is not intended, because the gradation control of each subpixel is not matched with an emission color intended to be extracted. Thus, light of the unintended additive color mixing is extracted.

Here, a deviation ellipse of MacAdam is considered as an example. A green color is not sensitive to chromaticity deviation, compared with red and blue colors, and a blue color is very sensitive to chromaticity deviation. Thus, blur in a display image is described by way of an example of the blue subpixel 1 having a blue emission color in the configuration of FIG. 4. The intrusion of light having a different emission color from a different gradation-controlled subpixel to a blue subpixel 22 leads to chromaticity deviation of blue. In this case, the blue subpixel 22 emits light at intended chromaticity, whereas emission light extracted from the region 21 between pixels adjacent to each other has an emission color with chromaticity deviation, which is mixed with a color of an adjacent red subpixel 23. Therefore, although a color close to a predetermined blue color is recognized on the blue subpixel 22, a color different from the predetermined blue color is recognized on the inter-pixel region 21. The blue subpixel 22 is recognized to have an emission color mixed with a red color, and hence, the color from the blue subpixel 22 is blurred. Further, in the inter-pixel region 21, chromaticity deviation with respect to predetermined gradation control on a pixel basis for displaying an image occurs, which leads to blur of an edge portion of a displayed image.

Figure 5:
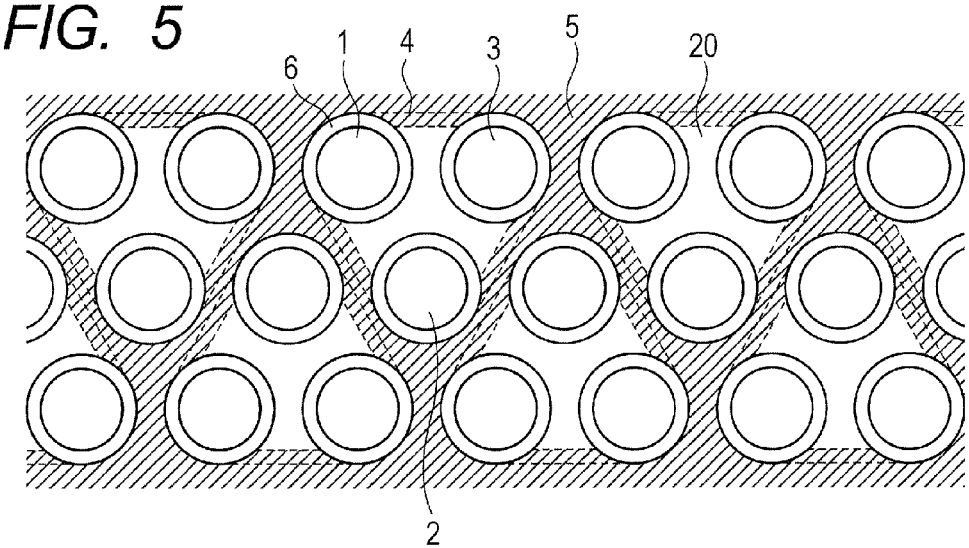
FIG. 5 is a top view schematically illustrating a configuration of a display apparatus according to another embodiment of the present invention.

In an aperture layout of pixels in a general display apparatus, the arrangement of pixels at an equal pitch is mainstream and an aperture ratio is generally at most about 50%, and hence, the area occupied by the inter-pixel region 21 is large. Thus, for example, unintended color mixing from a blue region, occurring in the inter-pixel region 21, forms a region having different chromaticity, which causes blur in a display image. In order to prevent blur, the present invention has a feature in that the visible light absorbing member 5 is arranged as illustrated in FIG. 2 in the inter-pixel region 21 illustrated in FIG. 4. A mode which is preferred for the configuration of FIG. 4 is illustrated in FIG. 5. In FIG. 5, by providing the visible light absorbing member 5 only in the inter-pixel region 21 without providing the visible light absorbing member 5 in the inter-subpixel region 20 in the pixel 4, the loss of light from the inter-subpixel region 20 in the pixel 4, which may be extracted while being mixed with another color, can be reduced.

Figure 6:
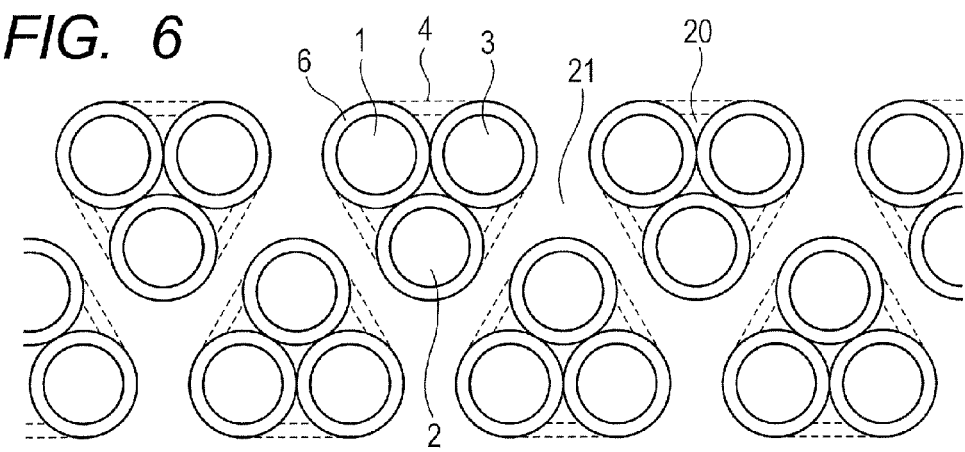
FIG. 6 is a top view schematically illustrating a configuration of a display apparatus according to still another embodiment of the present invention.

In contrast, it is preferred that the subpixels be in contact with each other through the intermediation of the light extraction structures 6 on a pixel basis as illustrated in FIG. 6, and the visible light absorbing member arranged only in the inter-pixel region 21 be continuously connected with a larger width to separate the pixels 4 from each other. Specifically, it is preferred that the visible light absorbing member connected in a network shape (grid shape) be formed so as to cover the inter-pixel region 21 also connected in a network shape (grid shape) as illustrated in FIG. 1. As described above, in the pixel 4, the color mixing between the adjacent subpixels is desired, and hence, the visible light absorbing member 5 may not be formed in the pixel 4 in the same manner as in the case of FIG. 5.

Figure 7:
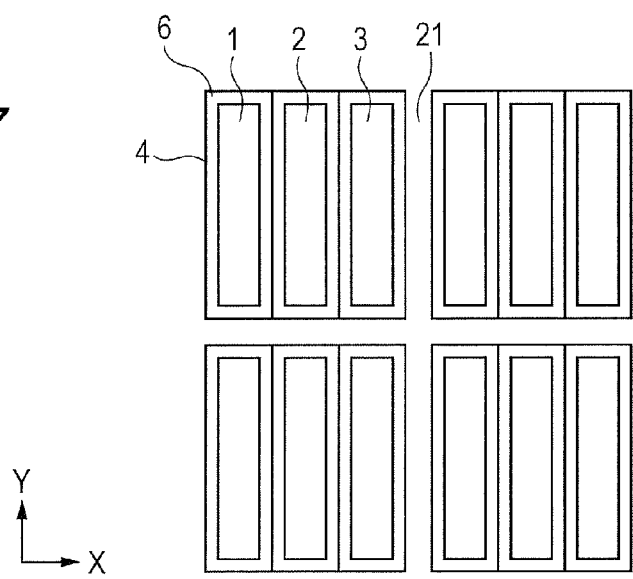
FIG. 7 is a top view schematically illustrating a configuration of a display apparatus according to yet still another embodiment of the present invention.

The aperture shape of the subpixels 1, 2, and 3 is not limited to a circular shape and may be a rectangular shape as illustrated in FIG. 7. For example, in the case where the light extraction structures 6 are provided so as to surround the outer circumferences of the respective rectangular subpixels 1, 2, and 3, the subpixels 1, 2, and 3 are provided in contact with each other through the light extraction structures 6 thereof to form the pixel 4. In the inter-pixel region 21 between the pixel 4 and the adjacent pixel 4, the visible light absorbing member 5 is formed.

Regarding the width of the inter-pixel region 21, that is, the distance between the pixels 4 adjacent to each other, the propagation distance of light needs to be considered. The propagation distance of light is defined as the distance between a light-emitting point and a point where the intensity of light at the light-emitting point becomes a half. The propagation distance of light is related to the film thickness and absorptance of the high-refractive-index transparent layer 13, an emission color, and the like. In the present invention, for the above-mentioned reason, the effect of solving a problem of blur by the visible light absorbing member 5 does not depend on an emission color. However, the width of the inter-pixel region 21 in which the visible light absorbing member 5 is arranged is at least a width which can separate the light extraction structures 6 from each other. It is preferred that the width of the inter-pixel region 21 in which the visible light absorbing member 5 be arranged is larger than that of the light extraction structure 6. Further, in FIG. 4, it is preferred that the width of the inter-pixel region in which the visible light absorbing member 5 is arranged be larger than that of the light extraction structure 6, and the ends of the light extraction structures 6 in the pixel be provided in contact with each other between the subpixels adjacent to each other.

As the visible light absorbing member 5, it is preferred to use a photosensitive black resist. Further, by irradiating the visible light absorbing member 5 with desired light, heating the visible light absorbing member 5, or changing an atmosphere, the wavelength region for absorbing light may be changed to cause the visible light absorbing member 5 to absorb light of a desired color. For example, by irradiating the visible light absorbing member 5 with light to effect photopolymerization, a transparent portion may be changed to a brown color or a black color. Further, materials used for a color filter or the like may be used alone or in combination to be provided in the inter-pixel region 21 as the visible light absorbing member 5. Preferred examples of a method of providing the visible light absorbing member 5 include patterning using photolithography, and coating of an ink jet type or a nozzle jet type and patterning. Note that, in order not to inhibit light extraction, it is preferred that the visible light absorbing member 5 be provided so as not to overlap the light extraction structure 6.

The step of forming the visible light absorbing member 5 may be performed before or after the step of providing the light extraction structure 6. In the former case, for example, a patterned black resist region may be provided on the bank 7 between the subpixels formed on the support substrate 8 of FIG. 2, or a portion corresponding to the inter-pixel region 21 may be formed as a black bank and a transparent material may be used as a bank between the subpixels in the pixel 4. In the latter case, for example, after the light extraction structure 6 is provided on the pixel 4, the inter-pixel region 21 may be coated with black ink as the visible light absorbing member 5 by an ink jet method.

By providing the visible light absorbing member 5 in the inter-pixel region 21 as described above, blur between pixels can be eliminated effectively.

Further, on the other hand, by using the visible light absorbing member 5 made of a black resist, the effect of reducing reflection of outside light can also be expected.

Note that, there is no particular limitation on a circuit and wiring for driving the display apparatus of the present invention, and the arrangement and characteristics of TFTs to be used, and the circuit, wiring, and TFTs may be designed as desired so as to obtain required performance.

Further, in the display apparatus of the present invention, the light extraction structure 6 is used for extracting light to be confined in the device outside, and the light extraction structure 6 may be further sealed with sealing glass such as a glass cap or a sheet glass. The sealing glass may be provided with a color filter for improving chromaticity and a circularly polarizing plate for reducing the reflection of outside light.

EXAMPLES

Hereinafter, the present invention is described by way of specific examples. In the examples, although a ring-shaped light extraction structure having cross-sectional structure in the shape of an isosceles triangle is used as an example, the present invention is not limited to this example.

Example 1

As Example 1, a display apparatus, in which an organic EL device had cross-sectional structure of FIG. 3, a display region had cross-sectional structure of FIG. 2, and pixels 4, subpixels 1, 2, and 3, and light extraction structures 6 were arranged as illustrated in FIG. 1, was produced by the following method. Specifically, the display apparatus of this example includes multiple pixels each including subpixels having multiple emission colors (blue subpixel 1, green subpixel 2, and red subpixel 3), and each of the subpixels includes an organic EL device.

In this example, first, a TFT drive circuit (not shown) made of low-temperature polysilicon was formed on a glass substrate, and a flattening film (not shown) made of an acrylic resin was formed on the TFT drive circuit to obtain a support substrate 8. Next, as a reflective electrode 9, an Ag alloy film was formed on the support substrate 8 by sputtering so as to have a film thickness of about 150 nm. The reflective electrode 9 made of an Ag alloy was a highly reflective film having a spectral reflectivity of 80% or more in a visible light wavelength region ($\lambda$=380 nm to 780 nm). Further, a film of indium tin oxide (ITO) was formed as a transparent electrode 14 by sputtering. After that, a polyimide-based resin was spin-coated as the bank 7, and apertures were respectively provided in intended subpixels by photolithography. The diameter of the aperture of each of the subpixels was 27 μm, and all of the subpixels were arranged at equal intervals of 60 μm.

After that, respective organic compound layers 10 and 11, and an organic compound layer including a red emission layer were successively formed and stacked by vacuum deposition. In the display apparatus of this example, for each of the subpixels 1, 2, and 3, the film thickness of a hole transport layer 16 was changed so that the optical film thickness from an emission layer of each color to the reflective electrode 9 corresponded to ¾ of each emission color wavelength. Regarding a blue color, a fluorescent material was used as a light-emitting dopant in the emission layer, and regarding green and red colors, a phosphorescent material, which was expected to exhibit higher internal quantum efficiency, was used as the light-emitting dopant in the emission layer. The refractive index of a layer having the highest refractive index in the organic compound layers of each subpixel was 1.86 in the blue subpixel, 1.80 in the green subpixel, and 1.78 in the red subpixel.

Next, a film of indium zinc oxide (IZO) was formed as a transparent electrode 12 by sputtering. Then, a silicon nitride (SiN) film was formed so as to have a thickness of 4 μm by CVD. The refractive index of the SiN film was 1.89 in a wavelength of 450 nm (blue color region), 1.88 in a wavelength of 520 nm (green color region), and 1.86 in a wavelength of 620 nm (red color region). Thus, the refractive index in any subpixel was higher than that of the organic compound layer.

Hexamethyldisilazane was spin-coated on the SiN film to modify the surface, and thereafter, a photoresist (AZ1500) was spin-coated to obtain a film having a film thickness of about 2.5 μm. Then, the photoresist was developed with a developer (AZ312MIF) to obtain a resist pattern. Post-baking was conducted on the developed photoresist at 120° C. for 3 minutes to reflow a resist shape. The SiN film was etched together with the resist pattern by dry etching using carbon tetrafluoride and oxygen, to thereby process the SiN film into the ring-shaped light extraction structure so as to surround each subpixel. At this time, the film thickness of the high-refractive-index transparent layer 13 having a refractive index higher than those of the organic compound layers 10 and 11, and the organic compound layer including the red emission layer was 1 μm. Further, the height of the ring-shaped light extraction structure 6 was 2.9 μm, the width thereof was 10 μm, the cross-sectional shape thereof was a triangle having an apex angle of 120° and an inside base angle of 30° and an outside base angle of 30°.

Next, a photosensitive black resist was spin-coated onto the SiN film which was directly processed as the visible light absorbing member 5 so as to have a film thickness of 1 μm. Then, as illustrated in FIG. 1, the photosensitive black resist was patterned through use of a photomask designed to be connected in a network shape so as to surround each subpixel. The photosensitive black resist was exposed to light through use of a mask aligner (MPA-600FA). Then, the photosensitive black resist was developed with a developer in which AZ312MIF and water were mixed at a ratio of 1:20, and thereafter, was heated at 100° C. for 3 minutes with a hot plate.

The width of the inter-subpixel region 20 (visible light absorbing member 5) was 13 μm. Thus, there were no sites having a width smaller than that of a bottom portion of the ring-shaped light extraction structure 6 in the inter-pixel region 21 (visible light absorbing member 5).

In order to check the degree of blur in the display apparatus thus produced, a human image was displayed against the background of the blue sky, and an emission color of a contour portion in a white site such as the skin was checked. In the contour portion of the human in the display image obtained in this example, no change in emission color derived from blur was found.

Further, in this example, the light extraction efficiency was enhanced about twice and the front luminance was enhanced about three times, compared with the case where no ring-shaped extraction structure 6 was provided. An increase in the emission intensity was found mainly in a front direction in which light was emitted.

Comparative Example 1

A display apparatus having the same configuration as that of Example 1 was produced by a production process similar to that of Example 1 with the exception that the visible light absorbing member 5 was not formed in the inter-subpixel region 20. When the degree of blur in the obtained display apparatus was checked in the same way as in Example 1, a change in emission color derived from blur was found in a contour portion of a human in a display image, and a bluish-violet blur was visually recognized in the contour portion. On the other hand, the light extraction efficiency was enhanced about 2.3 times and the front luminance was enhanced about 3.1 times, compared with the case where no ring-shaped extraction structure 6 was provided. Similarly to Example 1, an increase in luminance was found at all the viewing angles.

Example 2

A display apparatus as illustrated in FIG. 5 in which the visible light absorbing member 5 was not provided in the inter-subpixel region 20 in the pixel 4 was produced by the same method as that of Example 1. The width of the inter-pixel region 21 (visible light absorbing member 5) was 13 μm, and there were no sites having a width smaller than that of a bottom portion of the light extraction structure 6 in the inter-pixel region 21 (visible light absorbing member 5).

When the degree of blur in the obtained display apparatus was checked in the same way as in Example 1, no change in emission color derived from blur was found in a contour portion of a human in a display image.

The light extraction efficiency in this example was enhanced about 2.3 times and the front luminance was enhanced about 3.1 times, compared with the case where no ring-shaped extraction structure 6 was provided. An increase in luminance was found toward the front direction.

Example 3

A display apparatus having the same configuration as that of Example 1 was produced by a production method similar to that of Example 1 with the exception that the pitch of the subpixels was set to be smaller on a pixel basis so as to bring the ring-shaped light extraction structures 6 of the respective subpixels included in the pixel 4 into contact with each other, and the visible light absorbing member 5 was provided only in the inter-pixel region 21. The width of the inter-pixel region 21 (visible light absorbing member 5) was 26.0 μm at the minimum in directions of an axis 1, an axis 2, and an axis 3, and there were no sites having a width smaller than that of a base portion of the ring-shaped light extraction structure in the inter-pixel region 21.

When the degree of blur in the obtained display apparatus was checked in the same way as in Example 1, no change in emission color derived from blur was found in a contour portion of a human in a display image.

The light extraction efficiency in this example was enhanced about 2 times and the front luminance was enhanced about 3 times, compared with the case where no ring-shaped extraction structure 6 was provided. An increase in luminance was found toward the front direction.

Example 4

A display apparatus having the same configuration as that of Example 1 was produced by a production method similar to that of Example 1 with the exception that the light extraction structures 6 of the respective subpixels having a rectangular shape included in the pixel 4 were brought into contact with each other as illustrated in FIG. 7, and the visible light absorbing member 5 was provided only between the pixels 4. The widths of the inter-pixel region 21 (visible light absorbing member 5) in X-axis and Y-axis directions were respectively 13.0 μm, and, in the inter-pixel region 21 (visible light absorbing member 5), there were no sites having a width smaller than that of a base portion of the light extraction structure 6 provided at the outer circumference of a pixel aperture in FIG. 7.

When the degree of blur in the obtained display apparatus was checked in the same way as in Example 1, no change in emission color derived from blur was found in a contour portion of a human in a display image.

The light extraction efficiency in this example was enhanced about 2 times and the front luminance was enhanced about 3 times, compared with the case where no ring-shaped extraction structure 6 was provided. An increase in luminance was found toward the front direction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-212118, filed Sep. 28, 2011, which is hereby incorporated by reference herein in its entirety.

What is claimed is:

1. A display apparatus, comprising
multiple pixels each comprising multiple subpixels having different emission colors,
each of the multiple subpixels comprising an organic electroluminescence device which comprises:
a first electrode;
a second electrode; and
an organic compound layer comprising an emission layer disposed between the first electrode and the second electrode,
a transparent layer having a refractive index higher than a refractive index of the organic compound layer, disposed on a light exit side of the organic electroluminescence device, a light extraction structure provided on the transparent layer and an outer side of each of the multiple subpixels, and a light absorbing member disposed in a region between pixels adjacent to each other and not disposed in a region between subpixels adjacent to each other within each of the multiple pixels.

2. The display apparatus according to claim 1, wherein the light absorbing member is formed in a network shape.

3. The display apparatus according to claim 1, wherein the light absorbing member is a black bank.

4. The display apparatus according to claim 1, wherein a width of the region between the pixels adjacent to each other is larger than a width of the light extraction structure.

5. The display apparatus according to claim 1, wherein the light extraction structures provided on outer sides of the respective multiple subpixels within each of the multiple pixels are provided in contact with each other.

6. The display apparatus according to claim 1, wherein the light extraction structure has a protruding shape on the light exit side.

7. The display apparatus according to claim 1,
wherein a cross-section of the light extraction structure is a triangle, and
wherein an apex angle of the triangle is 120° or more and 135° or less.

8. The display apparatus according to claim 7, wherein the triangle is an isosceles triangle.

9. The display apparatus according to claim 1, wherein the light extraction structure is formed so as to surround each of the multiple subpixels.

10. The display apparatus according to claim 1, wherein the light extraction structure is formed of multiple conical structures.

11. The display apparatus according to claim 1, wherein the light extraction structure is formed of a ring-shaped structure in which conical structures are linked in a loop shape.

12. The display apparatus according to claim 1, wherein a light transmittance of the transparent layer is at least 85% in a visible light region.

13. The display apparatus according to claim 1, wherein the transparent layer comprises at least one of silicon nitride, titanium oxide, zirconium oxide, and zinc oxide.

14. The display apparatus according to claim 1, wherein the transparent layer has a film thickness of 0.5 μm or more and 6.0 μm or less.

15. The display apparatus according to claim 1, wherein the transparent layer has a film thickness of 0.5 μm or more and 1.0 μm or less.

* * * * *